United States Patent
Choi et al.

(10) Patent No.: US 10,304,920 B2
(45) Date of Patent: May 28, 2019

(54) DISPLAY DEVICE HAVING AN EMISSION LAYER

(71) Applicant: SAMSUNG DISPLAY CO., LTD., Yongin-si, Gyeonggi-Do (KR)

(72) Inventors: Jun Won Choi, Cheonan-si (KR); Dong Soo Kim, Seoul (KR); Hyun-Chol Bang, Seongnam-si (KR); Chang Soo Pyon, Seongnam-si (KR); Ji-Eun Lee, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/655,790

(22) Filed: Jul. 20, 2017

(65) Prior Publication Data

US 2018/0102400 A1    Apr. 12, 2018

(30) Foreign Application Priority Data

Oct. 11, 2016    (KR) .................. 10-2016-0131465

(51) Int. Cl.
*H01L 27/32*        (2006.01)
*H01L 29/786*       (2006.01)

(52) U.S. Cl.
CPC .......... *H01L 27/3272* (2013.01); *H01L 27/32* (2013.01); *H01L 27/3216* (2013.01);
(Continued)

(58) Field of Classification Search
CPC ............. H01L 27/3272; H01L 27/3276; H01L 29/78633
See application file for complete search history.

(56) References Cited

U.S. PATENT DOCUMENTS

| | | |
|---|---|---|
| 7,414,599 B2 | 8/2008 | Chung et al. |
| 2016/0210905 A1 | 7/2016 | Lee et al. |

(Continued)

FOREIGN PATENT DOCUMENTS

| | | |
|---|---|---|
| EP | 1081676 A1 | 3/2001 |
| KR | 10-2014-0007583 | 1/2014 |

(Continued)

OTHER PUBLICATIONS

Extended European Search Report dated Feb. 13, 20108 for Application No. 17190338.8.

*Primary Examiner* — Daniel P Shook

(74) *Attorney, Agent, or Firm* — F. Chau & Associates, LLC

(57) ABSTRACT

A display device includes signal lines and pixels connected thereto. A first pixel includes a first transistor including a first gate electrode, a first channel region overlapping the first gate electrode, a first source region, and a second drain region facing the first source region, with the first channel region interposed between the first source region and the second drain region. A third transistor includes a third gate electrode, a third channel region overlapping the third gate electrode, a third drain region connected to the first gate electrode, and a third source region facing the third drain region with the third channel region interposed between the third source region and the third drain region. A shielding part overlaps a boundary between the to third source region and the third channel region and does not overlap a boundary between the third drain region and the third channel region.

20 Claims, 15 Drawing Sheets

(52) U.S. Cl.
 CPC ...... *H01L 27/3262* (2013.01); *H01L 27/3276* (2013.01); *H01L 29/78633* (2013.01)

(56) References Cited

U.S. PATENT DOCUMENTS

2016/0247452 A1* 8/2016 Lee .................... H01L 27/3276
2017/0033171 A1 2/2017 Kim et al.

FOREIGN PATENT DOCUMENTS

| KR | 10-2016-0027917 | 3/2016 |
| KR | 10-2016-0060826 | 5/2016 |
| KR | 10-2016-0088535 | 7/2016 |

\* cited by examiner

DISPLAY DEVICE HAVING AN EMISSION LAYER

CROSS-REFERENCE TO RELATED APPLICATION

This application claims priority to and the benefit of Korean Patent Application No. 10-2016-0131465 filed in the Korean intellectual Property Office on Oct. 11, 2016, the entire contents of which are incorporated by reference herein.

TECHNICAL FIELD

The present disclosure relates to a display device, and more specifically, relates to a display device including an emission layer.

DISCUSSION OF THE RELATED ART

A display device for displaying an image includes a plurality of pixels. For example, a pixel of an organic light emitting diode (OLED) display may include an organic light emitting diode having a cathode, an anode, and an organic emission layer disposed therebetween. A plurality of transistors and at least one capacitor for driving the organic light emitting diode may also be included therein.

In the OLED display, electrons injected from the cathode and holes injected from the anode are combined in the organic emission layer to form an exciton. As the exciton returns to a relaxed state within the organic emission layer, energy is emitted in the form of light.

The plurality of transistors include at least one switching transistor and a driving transistor. At least one switching element may receive a data signal, which depends on a scan signal, and may transmit a voltage to the driving transistor. The driving transistor is directly or indirectly connected to the organic light emitting diode to control an amount of current transmitted to the organic light emitting diode, thereby emitting light of a desired luminance through each pixel.

The capacitor is connected to a driving gate electrode of the driving transistor, thereby maintaining a voltage of the driving gate electrode.

SUMMARY

A display device includes a plurality of signal lines and a plurality of pixels connected to the plurality of signal lines. A first pixel of the plurality of pixels includes a first transistor including a first gate electrode, a first channel region at least partially overlapping the first gate electrode in a plan view, a first source region, and a second drain region facing the first source region, with the first channel region interposed between the first source region and the second drain region. A third transistor includes a third gate electrode, a third channel region at least partially overlapping the third gate electrode in the plan view, a third drain region connected to the first gate electrode, and a third source region facing the third drain region with the third channel region interposed between the third source region and the third drain region. A shielding part at least partially overlaps a boundary between the third source region and the third channel region and does not overlap a boundary between the third drain region and the third channel region in the plan view.

A display device includes a plurality of signal lines and a plurality of pixels connected to the plurality of signal lines. A first pixel included in the plurality of pixels includes a first transistor including a first gate electrode, a first channel region at least partially overlapping the first gate electrode in the plan view, and a first source region and a second drain region facing each other with the first channel region interposed therebetween. A third transistor includes a third gate electrode, a third channel region at least partially overlapping the third gate electrode in the plan view, a third drain region connected to the first gate electrode, and a third source region facing the third drain region with the third channel region interposed therebetween. A shielding part at least partially overlaps at least one of a boundary between the third source region and the third channel region and a boundary between the third drain region and the third channel region. The shielding part is configured to transmit an initialization voltage.

A display device includes a plurality of signal lines and a plurality of pixels connected to the plurality of signal lines. A first pixel included in the plurality of pixels includes a first transistor including a first gate electrode, a first channel region at least partially overlapping the first gate electrode in the plan view, and a first source region and a second drain region facing each other with the first channel region interposed therebetween. A third transistor includes a third gate electrode, a third channel region at least partially overlapping the third gate electrode in the plan view, a third drain region connected to the first gate electrode, and a third source region facing the third drain region with the third channel region interposed therebetween. A shielding part at least partially overlaps at least one of a boundary between the third source region and the third channel region and a boundary between the third drain region and the third channel region. The shielding part is configured to transmit an initialization voltage.

An organic light emitting diode (OLED) display device includes a display substrate. A plurality of pixels is disposed on the display substrate. Each of the plurality of pixels includes a transistor. A plurality of signal lines is disposed on the display substrate and is connected to the plurality of pixels. The plurality of signal lines at least partially covers each transistor of the plurality of pixels.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
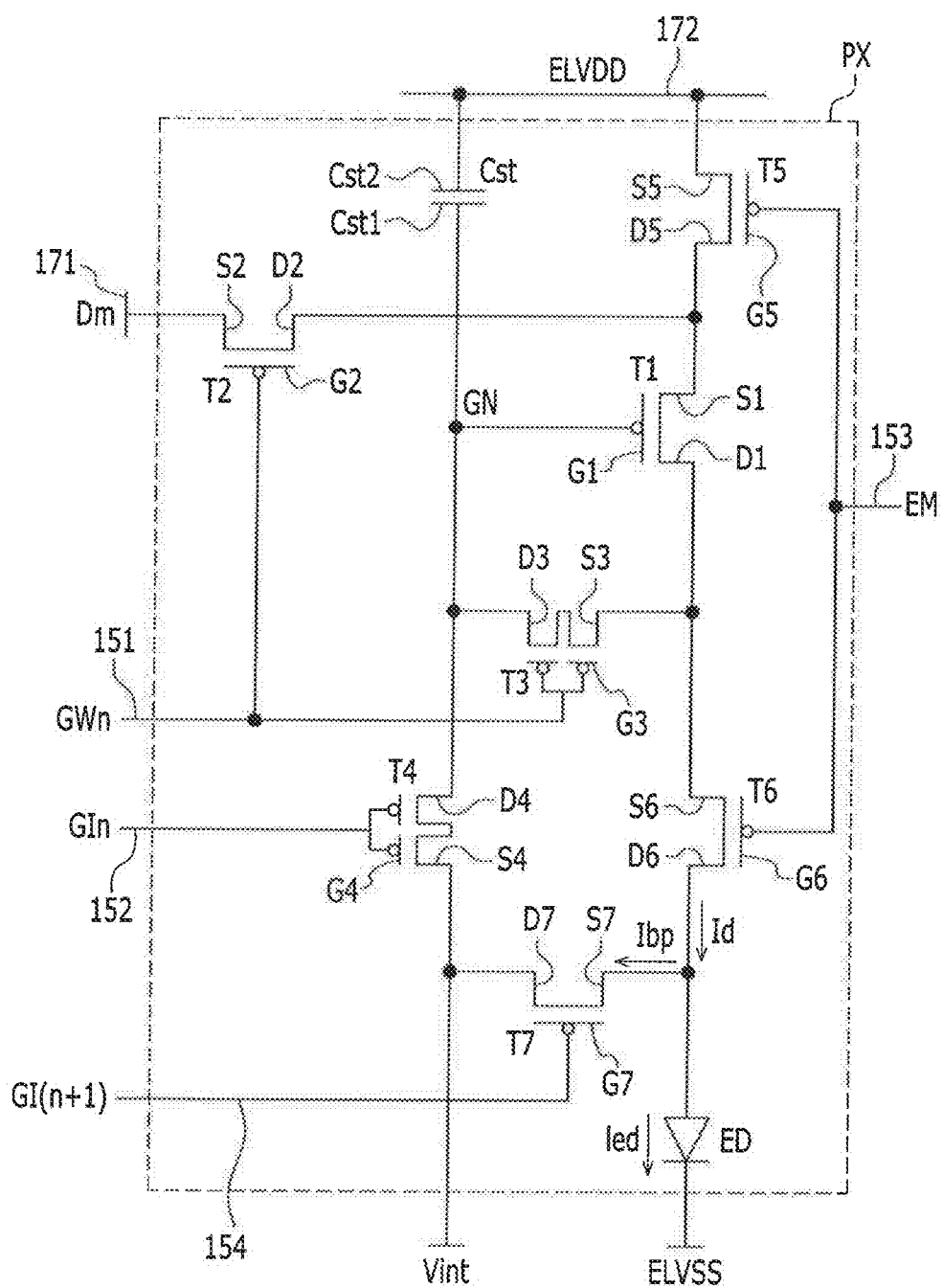
FIG. 1 is an equivalent circuit diagram illustrating one pixel of a display device according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The same reference numerals may be used to designate the same or similar constituent elements through the entire specification and the drawings.

In addition, the size and thickness of each configuration shown in the drawings, such as layers, films, panels, regions, etc. may be exaggerated for better understanding and ease of description, but the present invention is not limited thereto.

It will be understood that when an element such as a layer, film, region, or substrate is referred to as being "on" another element, it can be directly on the other element or intervening elements may also be present.

A display device according to an exemplary embodiment of the present invention will be described below with reference to FIG. 1.

FIG. 1 is an equivalent circuit diagram of one pixel of a display device according to an exemplary embodiment of the present invention.

Referring to FIG. 1, a display device, according to an exemplary embodiment of the present invention, includes a plurality of pixels PX displaying an image in response to an image signal and a plurality of signal lines 151, 152, 153, 154, 171, and 172. One pixel PX may include a plurality of transistors T1, T2, T3, T4, T5, T6, and T7 connected to the plurality of signal lines 151, 152, 153, 154, 171, and 172, a capacitor Cst, and at least one light emitting diode (LED) ED. According to an exemplary embodiment of the present invention, an example in which one pixel PX includes one light emitting diode (LED) ED is mainly described.

The signal lines 151, 152, 153, 154, 171, and 172 may include a plurality of scan lines 151, 152, and 154, a plurality of control lines 153, a plurality of data lines 171, and a plurality of driving voltage lines 172.

The plurality of scan lines 151, 152, and 154 may respectively transmit scan signals GWn, GIn, and GI(n+1). The scan signals GWn, GIn, and GI(n+1) may transmit a gate-on voltage and a gate-off voltage for turning-on/turning-off the transistors T2, T3, T4, and T7 included in the pixel PX.

The scan lines 151, 152, and 154 connected to one pixel PX may include a first scan line 151 transmitting a scan signal GWn, a second scan line 152 transmitting a scan signal GIn having the gate-on voltage at a different time from the first scan line 151, and a third scan line 154 transmitting the scan signal GI(n+1). According to an exemplary embodiment of the present invention, an example in which the second scan line 152 transmits the gate-on voltage at an earlier time than the first scan line 151 will be mainly described. For example, when the scan signal GWn is the n-th scan signal Sn (where n is a positive integer) among scan signals applied during one frame, the scan signal GIn may be a previous scan signal such as an (n−1)-th scan signal S(n−1), and the scan signal GI(n+1) may be an n-th scan signal Sn. However, the invention is not limited thereto, and the scan signal GI(n+1) may be a scan signal other than the n-th scan signal Sn.

The control line 153 may transmit a control signal. For example, the control line 153 may transmit a light emitting control signal controlling light emitting of the light emitting diode (LED) ED included in the pixel PX. The control signal transmitted by the control line 153 may transmit the gate-on voltage and the gate-off voltage and may have a different waveform from the scan signal(s) transmitted by the scan lines 151, 152, and 154.

The data line 171 may transmit a data signal Dm and the driving voltage line 172 may transmit a driving voltage ELVDD. The data signal Dm may have different voltage levels in response to the image signal input to the display device, and the driving voltage ELVDD may have a substantially constant level.

The display device may further include a driver transmitting the signals to the plurality of signal lines 151, 152, 153, 154, 171, and 172. For example, the driver may include a scan driver transmitting the scan signal to the plurality of scan line 151, 152, and 154 and a data driver transmitting the data signal to the data line 171. At least one driver may be formed directly on a display panel of the display device along with the plurality of transistors T1-T7 included in the pixel PX. Alternatively, at least one driver may be attached on the display panel in a type of at least one driving circuit chip. Alternatively, at least one driver may be attached on a printed circuit film connected to the display panel to transmit the signals to the display panel. The driver or the printed circuit film may be disposed around a display area of the display panel, in which the plurality of pixels PX are disposed.

The transistors T1, T2, T3, T4, T5, T6, and T7 may include a first transistor T1, a second transistor T2, a third transistor T3, a fourth transistor T4, a fifth transistor T5, a sixth transistor T6, and a seventh transistor T7.

The first scan line 151 may transmit the scan signal GWn to the second transistor T2 and the third transistor T3, the second scan line 152 may transmit the scan signal GIn to the fourth transistor T4, the third scan line 154 may transmit the scan signal GI(n+1) to the seventh transistor T7, and the control line 153 may transmit the light emitting control signal EM to the fifth transistor T5 and the sixth transistor T6.

A gate electrode G1 of the first transistor T1 is connected to one terminal Cst1 of the capacitor Cst through a driving gate node UN, a source electrode S1 of the first transistor T1 is connected to the driving voltage line 172 through the fifth transistor T5, and a drain electrode D1 of the first transistor T1 is electrically connected to an anode of the light emitting diode (LED) ED via the sixth transistor T6. The first transistor T1 receives a data signal Dm transmitted by the data line 171 in response to a switching operation of the second transistor T2 to supply a driving current Id to the light emitting diode (LED) ED.

A gate electrode G2 of the second transistor T2 is connected to the first scan line 151, a source electrode S2 of the second transistor T2 is connected to the data line 171, and a drain electrode D2 of the second transistor T2 is connected to the source electrode S1 of the first transistor T1 and to the driving voltage line 172 via the fifth transistor T5. The second transistor T2 is turned on in response to the scan signal GWn transmitted through the first scan line 151 such that the data signal Dm transmitted from the data line 171 may be transmitted to the source electrode S1 of the first transistor T1.

A gate electrode G3 of the third transistor T3 is connected to the first scan line 151, and a source electrode S3 of the third transistor T3 is connected to the drain electrode D1 of the first transistor T1 and to the anode of the organic light emitting diode OLED via the sixth transistor T6. A drain electrode D3 of the third transistor T3 is connected to a drain electrode D4 of the fourth transistor T4, one terminal Cst1 of the capacitor Cst, and the gate electrode of the first transistor T1. The third transistor T3 is turned on in response to the scan signal GWn transmitted through the first scan line 151 to diode-connect the first transistor T1 by connecting the gate electrode G1 and the drain electrode D1 of the first transistor T1 to each other.

A gate electrode G4 of the fourth transistor T4 is connected to the second scan line 152, a source electrode S4 of the fourth transistor T4 is connected to a terminal of an initialization voltage Vint, and a drain electrode D4 of the fourth transistor T4 is connected to one terminal Cst1 of the capacitor Cst and the gate electrode G1 of the first transistor T1 through the drain electrode D3 of the third transistor T3. The fourth transistor T4 is turned on in response to the previous scan signal GIn transmitted through the previous scan line 152 to transmit the initialization voltage Vint to the gate electrode G1 of the first transistor T1, thereby performing an initialization operation initializing the voltage of the gate electrode G1 of the first transistor T1.

A gate electrode G5 of the fifth transistor T5 is connected to the control line 153, a source electrode S5 of the fifth transistor T5 is connected to the driving voltage line 172, and a drain electrode D5 of the fifth transistor T5 is connected to the source electrode S1 of the first transistor T1 and the drain electrode D2 of the second transistor T2.

A gate electrode G6 of the sixth transistor T6 is connected to the control line 153, a source electrode S6 of the sixth transistor T6 is connected to the drain electrode D1 of the first transistor T1 and the source electrode S3 of the third transistor T3, and a drain electrode D6 of the sixth transistor T6 is electrically connected to the anode of the organic light emitting diode (LED) ED. The fifth transistor T5 and the sixth transistor T6 are simultaneously turned on in response to the light emitting control signal EM transmitted thorough the control line 153, and thus the driving voltage ELVDD is compensated by the diode-connected driving transistor T1 and may be transmitted to the light emitting diode (LED) ED, after being compensated by the diode-connected driving transistor T1.

A gate electrode G7 of the seventh transistor T7 is connected to the third scan line 154, a source electrode S7 of the seventh transistor T7 is connected to the drain electrode D6 of the sixth transistor T6 and the anode of the light emitting diode (LED) ED, and a drain electrode D7 of the seventh transistor T7 is connected to the terminal of the initialization voltage Vint and the source electrode S4 of the fourth transistor T4. Alternatively, the gate electrode G7 of the seventh transistor T7 may be connected to a separate control line.

The transistors T1, T2, T3, T4, T5, T6, and T7 may each be a P-type channel transistor such as a PMOS, however the present invention is not limited thereto, and at least one among the transistors T1, T2, T3, T4, T5, T6, and T7 may be an N-type channel transistor.

One terminal Cst1 of the capacitor Cst is connected to the gate electrode G1 of the first transistor T1 as described above, and the other terminal Cst2 thereof is connected to the driving voltage line 172. A cathode of the light emitting diode (LED) ED may be connected to a common voltage ELVSS terminal transmitting a common voltage ELVSS to receive the common voltage ELVSS.

The structure of the pixel PX, according to an exemplary embodiment of the present invention, is not limited to the structure shown in FIG. 1, and a number of transistors and a number of capacitors that are included in one pixel PX and a connection relationship thereof may be variously modified.

Next, a driving method of the display device, according to an exemplary embodiment of the present invention, will be described with reference to FIG. 2 along with FIG. 1. In the present description, an example in which the transistors T1, T2, T3, T4, T5, T6, and T7 are P-type channel transistors is described, and an operation of one frame will be described.

Figure 2:
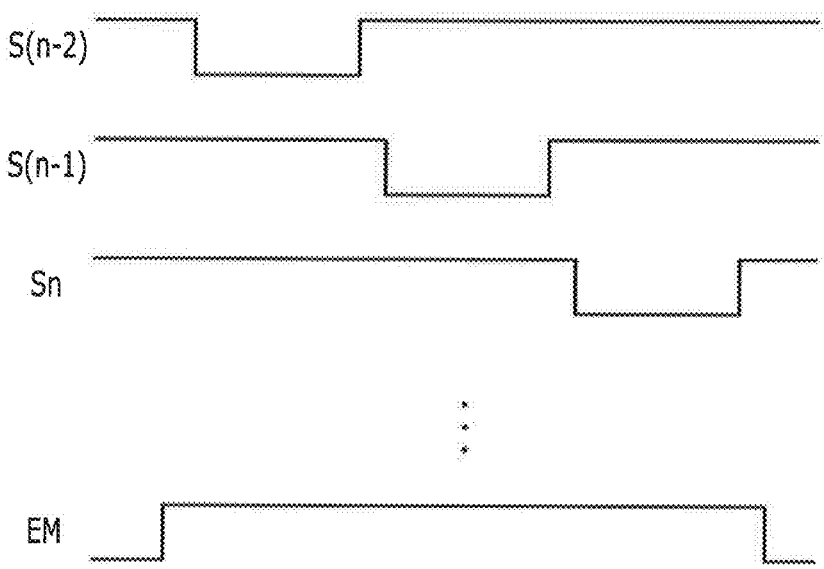
FIG. 2 is a timing diagram illustrating driving signals of a display device according to an exemplary embodiment.

Referring to FIG. 2, in one frame, the scan signals . . . , S(n−2), S(n−1), Sn, . . . of a low level may be sequentially applied to the plurality of first scan lines 151 connected to the plurality of pixels PX.

A scan signal GIn of a low level is supplied through the second scan line 152 for an initialization period. For example, the scan signal GIn may be a (n−1)-th scan signal S(n−1). Then, the fourth transistor T4 is turned on in response to the scan signal GIn of the low level, the initialization voltage Vint is connected to the gate electrode G1 of the first transistor T1 through the fourth transistor T4, and the driving transistor T1 is initialized by the initialization voltage Vint.

Subsequently, if the scan signal GWn of the low level is supplied through the first scan line 151 during a data programming and compensation period, the second transistor T2 and the third transistor T3 are turned on in response to the scan signal GWn of the low level. For example, the scan signal GWn may be an (n-th) scan signal Sn. In this case, the first transistor T1 is diode-connected by the turned-on third transistor T3 and is biased in a forward direction. Accordingly, a compensation voltage (Dm+Vth, Vth is a negative value) decreased by a threshold voltage Vth of the first transistor T1 from the data signal Dm supplied from the data line 171 is applied to the gate electrode G1 of the first transistor T1. For example, the gate voltage applied to the gate electrode G1 of the first transistor T1 may become the compensation voltage (Dm+Vth).

The driving voltage ELVDD and the compensation voltage (Dm+Vth) may be respectively applied to both terminals of the capacitor Cst, and the capacitor Cst may be charged with a charge corresponding to a voltage difference of both terminals.

Next, the light emitting control signal EM supplied from the control line 153 is changed from the high level to the low level during a light emitting period. A time when the light emitting control signal EM is changed from the high level to the low level may be after the scan signal GWn is applied to all first scan lines 151 in one frame. Thus, during the light emitting period, the fifth transistor T5 and the sixth transistor T6 are turned on by the light emitting control signal EM of the low level. Thus, a driving current Id is generated in response to the voltage difference between the gate voltage of the gate electrode G1 of the first transistor T1 and the driving voltage ELVDD, and the driving current Id is supplied to the light emitting diode ED through the sixth transistor T6, thereby a current led flows to the light emitting diode ED. The gate-source voltage Vgs of the first transistor T1 is maintained as '(Dm+Vth)-ELVDD' by the capacitor Cst during the light emission period, and in response to a current-voltage relationship of the first transistor T1, the driving current Id may be proportional to a square '(Dm-ELVDD)$^2$' of a value obtained by subtracting the threshold voltage from the driving gate-source voltage. Accordingly, the driving current Id may be determined regardless of the threshold voltage Vth of the first transistor T1.

During an initialization period, the seventh transistor T7 receives the scan signal GI(n+1) of the low level through the third scan line 154 to be turned on. The scan signal GI(n+1) may be an n-th scan signal Sn. In this case, the seventh transistor T7 may be simultaneously turned-on with the second and third transistors T2 and T3. A part of the driving current Id may flow out through the seventh transistor T7 as a bypass current Ibp by the turned-on seventh transistor T7.

Next, an example of the detailed structure of the display device, according to an exemplary embodiment of the present invention, will be described with reference to FIG. 3 to FIG. 8 along with FIG. 1 and FIG. 2.

For ease of understanding, a plane structure of the display device, according to an exemplary embodiment of the present invention, is firstly described and then a cross-sectional structure is described in detail.

Figure 3:
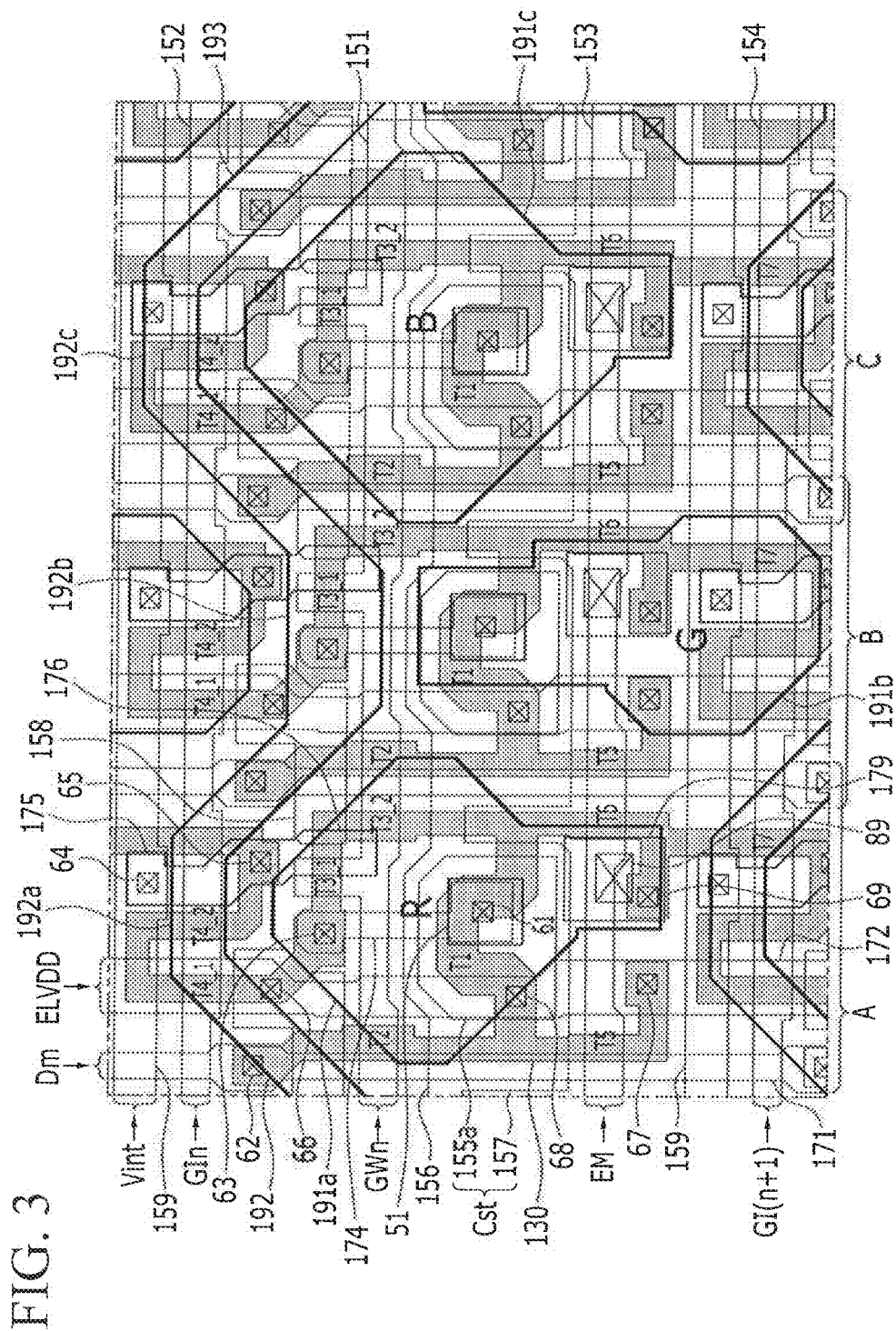
FIG. 3 is a top plan view illustrating a plurality of pixels of a display device according to an exemplary embodiment of the present invention.
Figure 4:
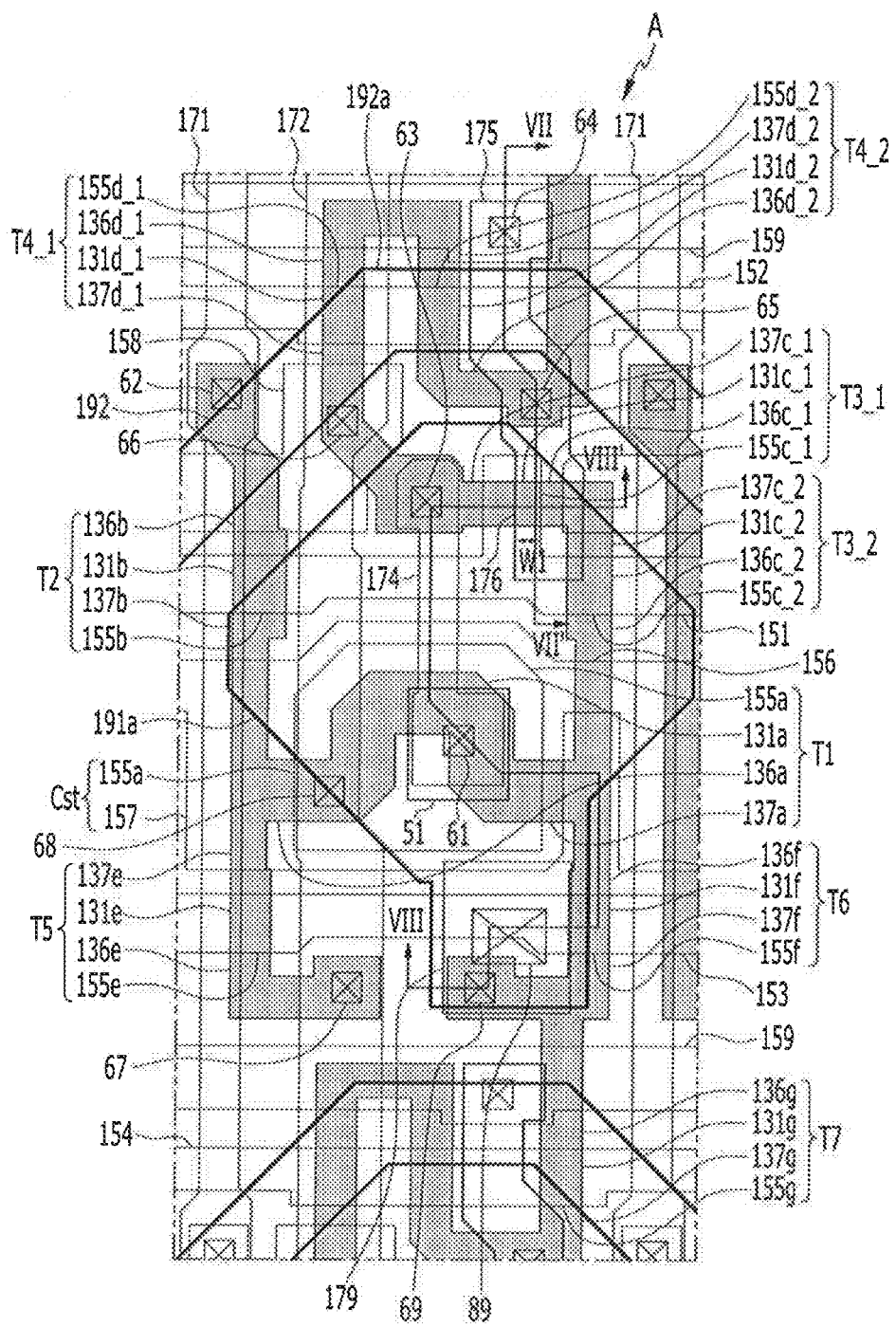
FIG. 4 to FIG. 6 are top plan views illustrating one pixel among a plurality of pixels shown in FIG. 3.
Figure 5:
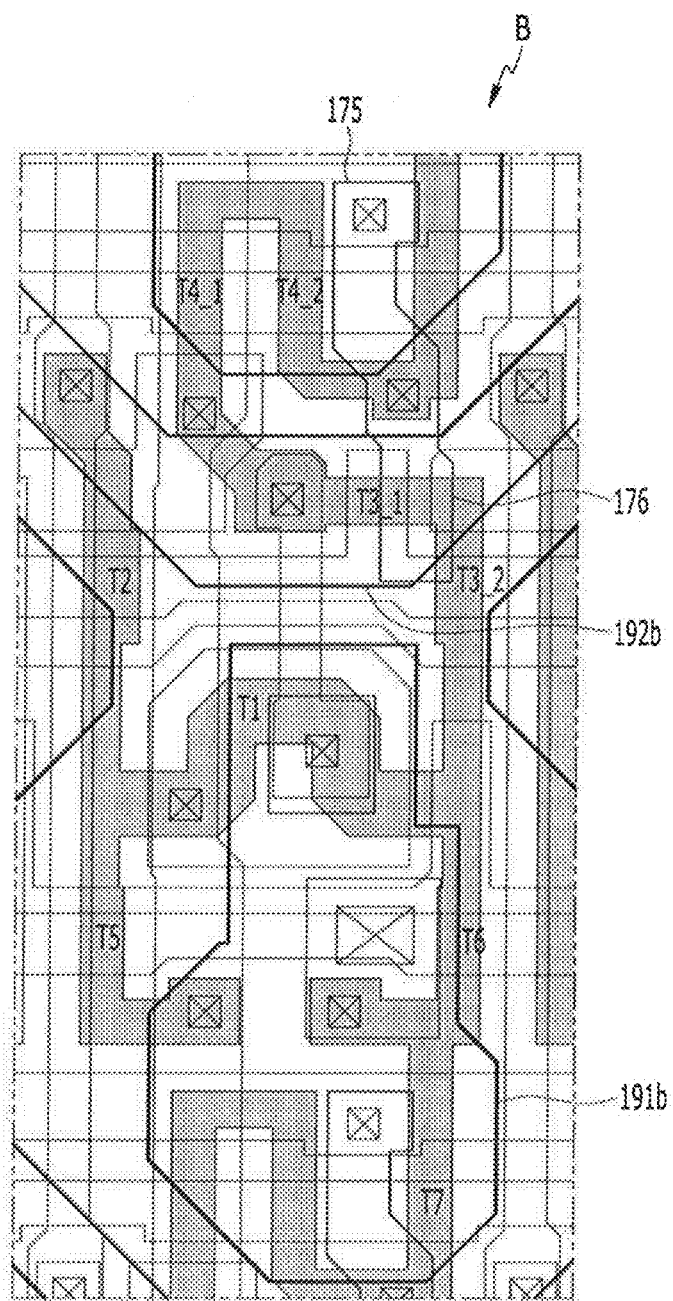
Figure 6:
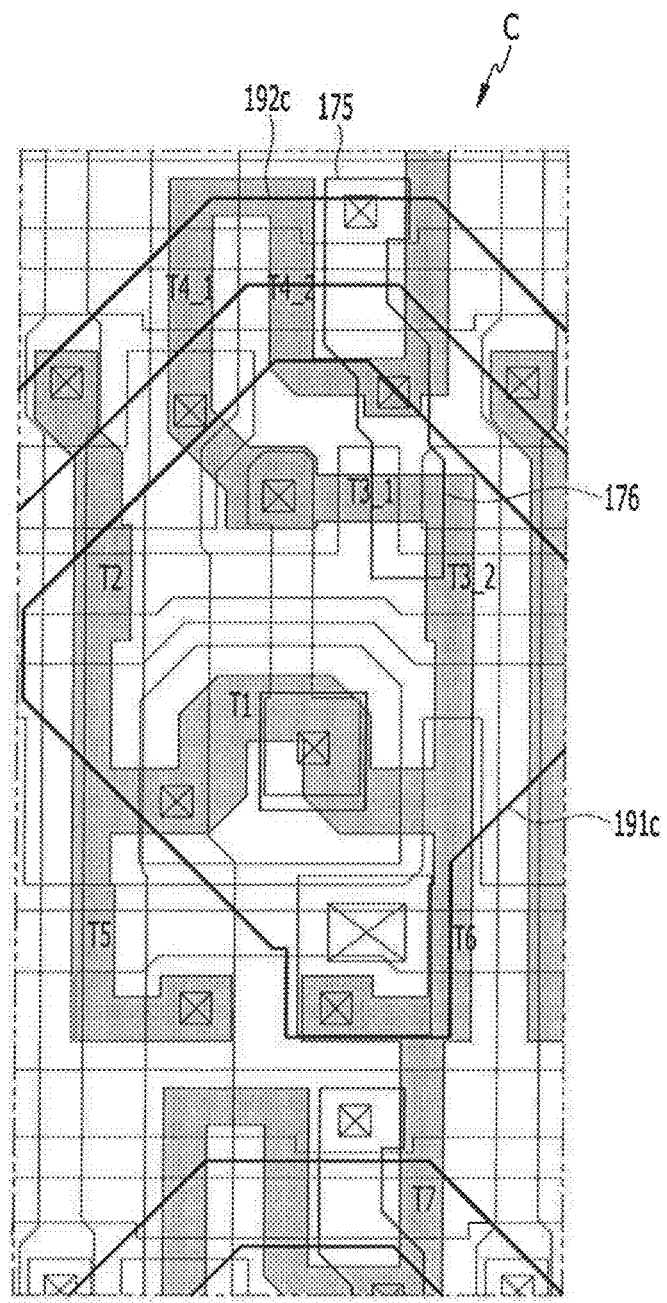
Figure 7:
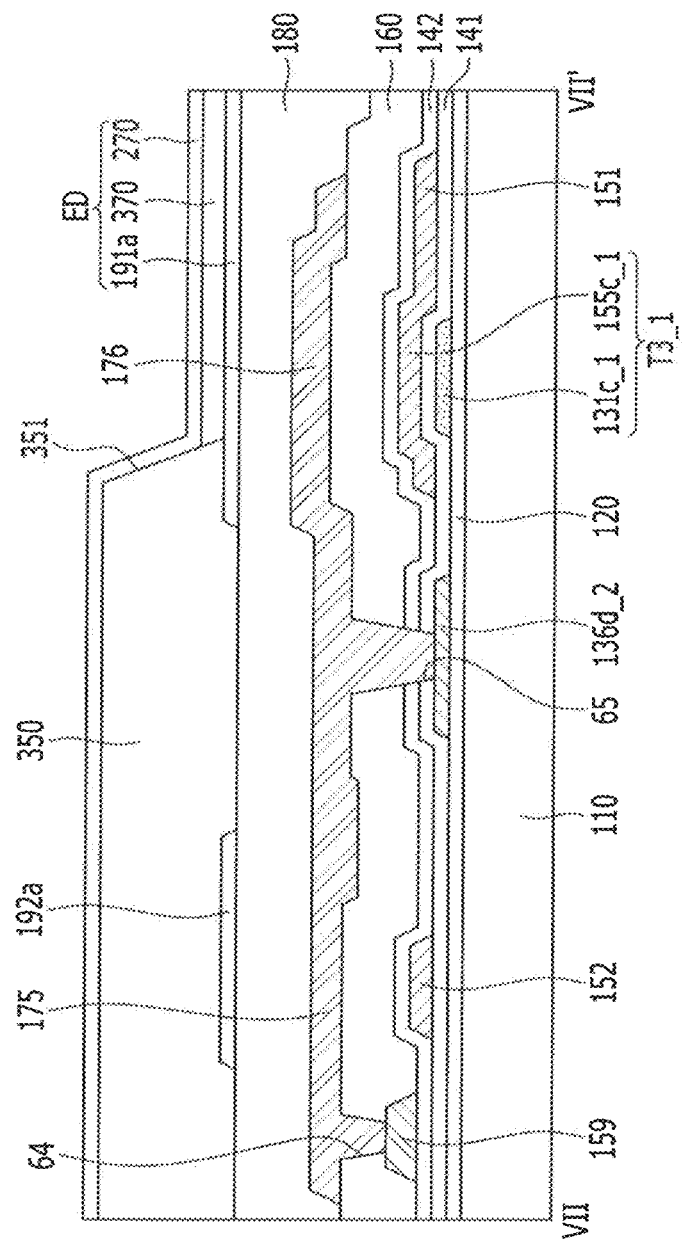
FIG. 7 is a cross-sectional view illustrating a display device shown in FIG. 4 taken along a line VII-VII'.
Figure 8:
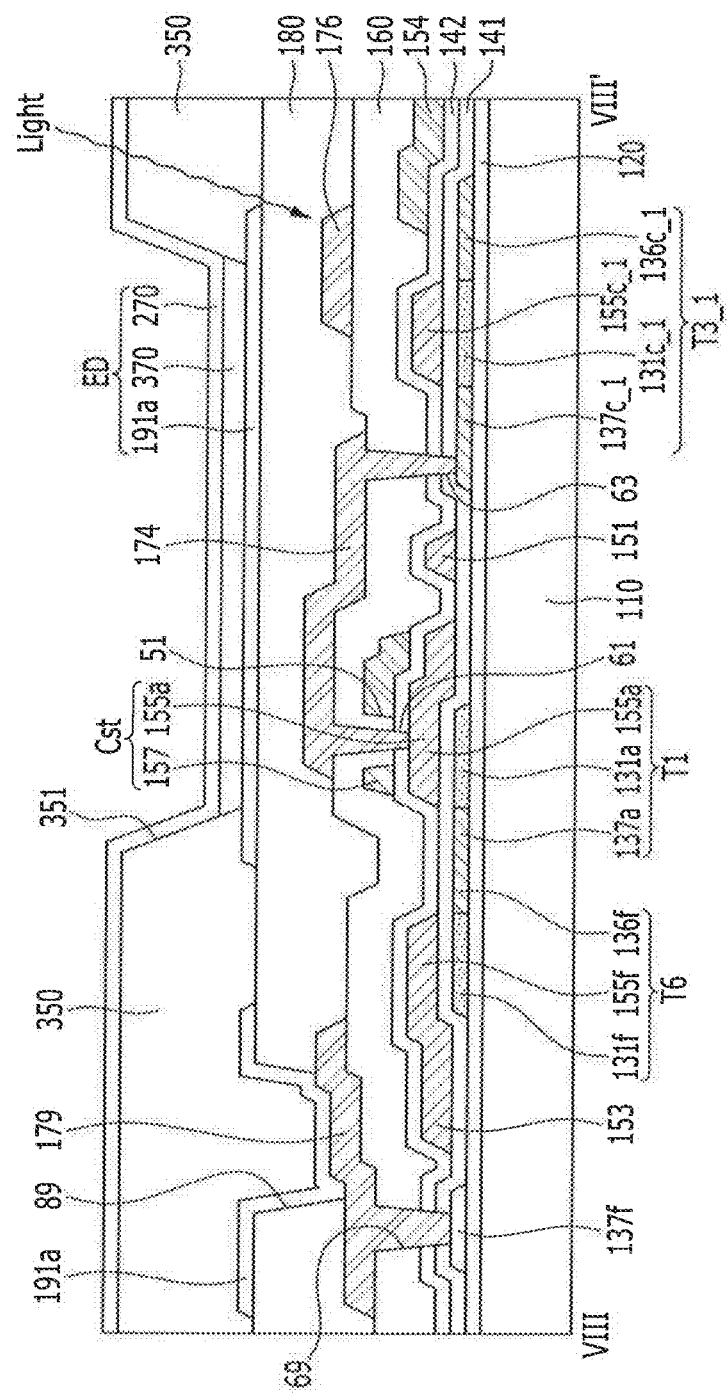
FIG. 8 is a cross-sectional view illustrating a display device shown in FIG. 4 taken along a line VIII-VIII'.

FIG. 3 is a top plan view of a plurality of pixels of a display device, according to an exemplary embodiment of the present invention, FIG. 4 is a top plan view of a region indicated by 'A' in FIG. 3, FIG. 5 is a top plan view of a region indicated by 'B' in FIG. 3, and FIG. 6 is a top plan view of a region indicated by 'C' in FIG. 3.

The plurality of pixels PX included in the display device, according to an exemplary embodiment of the present invention, may respectively display a predetermined color. The plurality of pixels, for example, may include a red pixel R representing a red color, a green pixel G representing a green color, and a blue pixel B representing a blue color, FIG. 3 shows the red pixel R, the green pixel G, and the blue pixel B that are adjacent to each other. Alternatively, at least one among the red pixel R, the green pixel G, and the blue pixel B may represent different colors.

The display device, according to an exemplary embodiment of the present invention, may include a first conductive layer including the first scan line 151 transmitting the scan signal GWn, the second scan line 152 transmitting the scan signal GIn, the third scan line 154 transmitting the scan signal GI(n+1), and the control line 153 transmitting the light emitting control signal EM. The first conductive layer is disposed on one surface of a substrate 110 in the cross-sectional view, and may include the same material and may be disposed on the same layer.

The substrate 110 may include an inorganic or organic insulating material such as glass, plastic, etc., and may be flexible.

The plurality of scan lines 151, 152, and 154 and the control line 153 may extend in the same direction (e.g., a horizontal direction in FIG. 3) in the plan view. The first scan line 151 may be disposed between the second scan line 152 and the control line 153 in the plan view. When viewing the entire display device, the third scan line 154 as a scan line substantially such as the second scan line 152 may transmit the scan signal GI(n+1) next to the scan signal GIn transmitted by the second scan line 152. As described above, when the first scan line 151 transmits the n-th scan signal Sn, the third scan line 154 may also transmit the n-th scan signal Sn.

The display device, according to an exemplary embodiment of the present invention, may further include a second conductive layer including a storage line 156 and an initialization voltage line 159. The second conductive layer is disposed on a different layer from the first conductive layer in the cross-sectional view. For example, the second conductive layer may be disposed on the first conductive layer, may include the same material, and may be disposed in the same layer.

The storage line 156 and the initialization voltage line 159 may extend in primarily the same direction (e.g., the horizontal direction in FIG. 3) in the plan view.

The storage line 156 may be disposed between the first scan line 151 and the control line 153 in the plan view and may include an extension part 157 disposed in each pixel R, G, and B. The extension part 157 is connected to the driving voltage line 172 through a contact hole 68 thereby receiving the driving voltage ELVDD. The extension part 157 may have an opening 51.

The initialization voltage line 159 may transmit the initialization voltage Vint and may be disposed between the third scan line 154 and the control line 153 in the plan view, but the position is not limited thereto.

The display device, according to an exemplary embodiment of the present invention, may further include a third conductive layer including the data line 171 transmitting the data signal Dm and the driving voltage line 172 transmitting the driving voltage ELVDD. The third conductive layer is disposed at the different layer from the first conductive layer and the second conductive layer in the cross-sectional view. For example, the third conductive layer may be disposed on the second conductive layer in the cross-sectional view, may include the same material, and may be disposed in the same layer.

The data line 171 and the driving voltage line 172 may extend primarily in the same direction (e.g., the vertical direction in FIG. 3) in the plan view, and may cross the plurality of scan lines 151, 152, and 154, the control line 153, the initialization voltage line 159, and the storage line 156.

Each of the pixels R, G, and B may include the plurality of transistors T1, T2, T3, T4, T5, T6, and T7 connected to the scan lines 151, 152, and 154, the control line 153, the data line 171, and the driving voltage line 172, the capacitor Cst, and the light emitting diode (LED) ED.

Each channel of the plurality of transistors T1, T2, T3, T4, T5, T6, and T7 for one pixel PX may be formed in one active pattern 130, and the active pattern 130 may be curved in various shapes. The active pattern 130 may include a semiconductor material such as a polysilicon or an oxide semiconductor.

The active pattern 130 may be disposed between the substrate 110 and the first conductive layer in the cross-sectional view.

The active pattern 130 includes channel regions 131a, 131b, 131c_1, 131c_2, 131d_1, 131d_2, 131e, 131f, and 131g forming each channel of the transistors T1, T2, T3, T4, T5, T6, and T7 and a conductive region. For example, the third transistor T3 and the fourth transistor T4 may have a dual gate structure. In this case, the third transistor T3 includes two channel regions 131$c$_1, and 131$c$_2, and the fourth transistor T4 also includes two channel regions 131$d$_1, and 131$d$_2.

The conductive region of the active pattern 130 is disposed at both sides of each of the channel regions 131$a$, 131$b$, 131$c$_1, 131$c$_2, 131$d$_1, 131$d$_2, 131$e$, 131$f$, and 131$g$ and has a higher carrier concentration than the carrier concentration of the channel regions 131$a$, 131$b$, 131$c$_1, 131$c$_2, 131$d$_1, 131$d$_2, 131$e$, 131$f$, and 131$g$. In the active pattern 130, most of the rest of the portion except for the channel regions 131$a$, 131$b$, 131$c$_1, 131$c$_2, 131$d$_1, 131$d$_2, 131$e$, 131$f$, and 131$g$ may be the conductive region. A pair of conductive regions disposed at both sides of the channel regions 131$a$, 131$b$, 131$c$_1, 131$c$_2, 131$d$_1, 131$d$_2, 131$e$, 131$f$, and 131$g$ of each of the transistors T1, T2, T3, T4, T5, T6, and T7 as a source region and a drain region of the corresponding transistors T1, T2, T3, T4, T5, T6, and T7 may function as the source electrode and the drain electrode.

The first transistor T1 includes a channel region 131$a$, a source region 136$a$ and a drain region 137$a$ that are conductive regions of the active pattern 130 disposed at respective sides of the channel region 131$a$, and a driving gate electrode 155$a$ overlapping the channel region 131$a$ in the plan view.

The channel region 131$a$ of the first transistor T1 may be bent at least one time. For example, the channel region 131$a$ may have a meandering shape or a zigzag shape. FIG. 3 to FIG. 6 show an example in which the channel region 131$a$ has a U-shape that is alternately disposed up-facing and down-facing.

The source region 136$a$ and the drain region 137$a$ are connected to respective sides of the channel region 131$a$ in the plan view.

The driving gate electrode 155$a$ may be included in the first conductive layer and may be connected to a connector 174 through a contact hole 61. The contact hole 61 may be disposed inside the opening 51 in a plan view. The connector 174 may be included in the third conductive layer in the cross-sectional view. The connector 174 may be elongated in a direction primarily parallel to a direction in which the data line 171 extends. The connector 174 corresponds to a driving gate node ON shown in a circuit diagram of FIG. 1 along with the driving gate electrode 155$a$.

The second transistor T2 includes the channel region 131$b$, a source region 136$b$ and a drain region 137$b$ that are conductive regions of the active pattern 130 disposed at respective sides of the channel region 131$b$, and a gate electrode 155$b$ overlapping the channel region 131$b$ in the plan view. The gate electrode 155$b$ is a part of the first scan line 151. The source region 136$b$ is disposed upward based on the first scan line 151 in the plan view, is connected to the channel region 131$b$, and is connected to the data line 171 through a contact hole 62. The drain region 137$b$ is disposed downward based on the first scan line 151 in the plan view, is connected to the channel region 131$b$, and is connected to the source region 136$a$ of the first transistor T1.

The third transistor T3 may be formed of two parts to prevent the leakage current. For example, the third transistor T3 may include an upper third transistor T3_1 and a lower third transistor T3_2 adjacent to each other and connected to each other.

The upper third transistor T3_1 includes the channel region 131$c$_1 overlapping the first scan line 151 in the plan view, a source region 136$c$_1 and a drain region 137$c$_1 that are conductive regions of the active pattern 130 disposed at respective sides of the channel region 131$c_{13}$ 1, and a gate electrode 155$c$_1 overlapping the channel region 131$c$_1. The gate electrode 155$c$_1 may be a part of a protrusion of the first scan line 151. The drain region 137$c$_1 is disposed upward based on the first scan line 151 in the plan view, and is connected to the connector 174 through a contact hole 63.

The lower third transistor T3_2 includes the channel region 131$c$_2 overlapping the first scan line 151 in the plan view, a source region 136$c$_2 and a drain region 137$c$_2 that are conductive regions of the active pattern 130 disposed at respective sides of the channel region 131$c$_2, and a gate electrode 155$c$_2 overlapping the channel region 131$c$_2. The gate electrode 155$c$_2 is a part of the first scan line 151. The source region 136$c$_2 of the lower third transistor T3_2 is connected to the drain region 137$a$ of the first transistor T1, and the drain region 137$c$_2 is connected to the upper source region 136$c$_1 of the third transistor T3_1.

The fourth transistor T4 may also be formed of two parts to prevent the leakage current. For example, the fourth transistor T4 may include a left fourth transistor T4_1 and a right fourth transistor T4_2 adjacent to each other and connected to each other.

The left fourth transistor T4_1 includes the channel region 131$d$_1 overlapping the second scan line 152 in the plan view, a source region 136$d$_1 and a drain region 137$d$_1 that are the conductive region of the active pattern 130 disposed at respective sides of the channel region 131$d$_1, and a gate electrode 155$d$_1 overlapping the channel region 131$d$_1. The gate electrode 155$d$_1 is a part of the second scan line 152. The drain region 137$d$_1 is disposed downward based on the second scan line 152 in the plan view, is connected to the drain region 137$c$_1 of the upper third transistor T3_1, and is connected to the connector 174 through the contact hole 63.

The right fourth transistor T4_2 includes the channel region 131$d$_2 overlapping the second scan line 152 in the plan view, a source region 136$d$_2 and a drain region 137$d$_2 that are the conductive regions of the active pattern 130 disposed at respective sides of the channel region 131$d$_2, and a gate electrode 155$d$_2 overlapping the channel region 131$d$_2. The gate electrode 155$d$_2 is a part of the second scan line 152. The drain region 137$d$_2 is connected to the source region 136$d$_1 of the left fourth transistor T4_1, and the source region 136$d$_2 is connected to a connector 175 through a contact hole 65.

The connector 175 may be included in a second conductive layer or a third conductive layer in the cross-sectional view. When the connector 175 is included in the third conductive layer, the connector 175 is electrically connected to the initialization voltage line 159 through a contact hole 64. When the connector 175 is included in the second conductive layer, the connector 175 is disposed on the same layer as the initialization voltage line 159 in the cross-sectional view, and may be connected to the initialization voltage line 159.

A boundary between the channel region 131$d$_1 of the left fourth transistor T4_1 connected to the connector 174 transmitting a voltage of the driving gate electrode 155$a$ and the source region 136$d$_1 and a boundary between the and channel region 131$d$_1 and the drain region 137$d$_1 may each be covered by the driving voltage line 172 along with the channel region 131$d$_1 in the plan view. The channel region 131$d$_1, the boundary between the channel region 131$d$_1 and the source region 136$d$_1, and the boundary between the channel region 131$d$_1 and the drain region 137$d$_1 overlaps the driving voltage line 172 in the plan view, and may be disposed in a plane region of the driving voltage line 172. In the plan view, a width of each of the channel region 131d_1, the source region 136d_1, and the drain region 137d_1 of the left fourth transistor T4_1 in the horizontal direction is smaller than a width of the driving voltage line 172 in the horizontal direction, and the channel region 131d_1, the source region 136d_1, and the drain region 137d_1 may all be disposed within the region of the driving voltage line 172.

Accordingly, although external light (e.g., such as the light shown in FIG. 8) is incident to the display device, the external light is blocked by the driving voltage line 172 such that the external light may be prevented from being incident to the channel region 131d_1 of the left fourth transistor T4_1. Accordingly, the leakage current that would otherwise be caused by the light is prevented by the left fourth transistor T4_1 directly connected to the driving gate node GN such that the voltage change of the capacitor Cst may be suppressed. A display failure such as a luminance change of the image and a color coordinate change may accordingly be prevented.

There is an upper third transistor T3_1 as one transistor that is directly connected to the connector 174 transmitting the voltage of the driving gate electrode 155a. The boundary between the channel region 131c_1 of the upper third transistor T3_1 and the source region 136c_1 and/or the boundary between the channel region 131c_1 and the drain region 137c_1 is covered by a shielding part 176 in the plan view. For example, at least one of the boundary between the channel region 131c_1 and the source region 136c_1 and the boundary between the channel region 131c_1 and the drain region 137c_1 overlaps the shielding part 176 in the plan view, thereby being disposed in the region of the shielding part 176.

For example, as shown above, the shielding part 176 overlaps the boundary between the channel region 131c_1 of the upper third transistor T3_1 and the source region 136c_1 in the plan view. The shielding part 176 might not overlap the boundary of the channel region 131c_1 of the upper third transistor T3_1 and the drain region 137c_1 and accordingly, these elements may be spaced apart from the connector 174, in the plan view.

In the plan view, the width W1 as a distance from the boundary between the channel region 131c_1 of the upper third transistor T3_1 and the source region 36c_1 to one edge of a left or a right of the shielding part 176 may be about 3 micrometers or more, however the width W1 it is not limited thereto.

The shielding part 176 may be included in the second conductive layer or the third conductive layer. When the shielding part 176 is included in the third conductive layer, the shielding part 176 may be disposed on the same layer as the connector 175, and may be electrically and physically connected to the connector 175. The shielding part 176 may be spaced apart from the connector 174 connected to the driving gate electrode 155a by a predetermined distance.

Alternatively, the shielding part 176 may further include a part overlapping the boundary between the channel region 131c_1 of the upper third transistor T3_1 and the drain region 137c_1 in the plan view. For example, when the shielding part 176 is disposed on a different layer from the connector 174 in the cross-sectional view, as described above, the shielding part 176 may include a part overlapping the boundary between the channel region 131c_1 of the upper third transistor T3_1 and the source region 136c_1 and the boundary between the channel region 131c_1 and the drain region 137c_1 in the plan view.

According to an exemplary embodiment of the present invention, although the external light is incident to the display device, the external light is blocked by the shielding part 176 such that the external light may be prevented from being incident through the boundary part between the channel region 131c_1 of the upper third transistor T3_1 and the source region 136c_1 and/or the drain region 137c_1. Accordingly, the leakage current due to the light is prevented by the upper third transistor T3_1 directly connected to the driving gate node GN such that the voltage change of the capacitor Cst may be suppressed, and resultantly a display failure such as a luminance change of the image and a color coordinate change may be prevented.

The fifth transistor T5 includes the channel region 131e, a source region 136e and a drain region 137e that are the conductive regions of the active pattern 130 disposed at respective sides of the channel region 131e, and a gate electrode 155e overlapping the channel region 131e. The gate electrode 155e is a part of the control line 153. The source region 136e is disposed downward based on the control line 153 in the plan view, is connected to the channel region 131e, and is connected to the driving voltage line 172 through a contact hole 67. The drain region 137e is disposed upward based on the control line 153 in the plan view, is connected to the channel region 131e, and is connected to the source region 136a of the first transistor T1.

The sixth transistor T6 includes the channel region 131f, a source region 136f and a drain region 137f that are the conductive regions of the active pattern 130 disposed at respective sides of the channel region 131f, and a gate electrode 155f overlapping the channel region 131f. The gate electrode 155f is a part of the control line 153. The source region 136f is disposed upward based on the control line 153 in the plan view, is connected to the channel region 131f, and is connected to the drain region 137a of the first transistor T1. The drain region 137f is disposed downward based on the control line 153 in the plan view, is connected to the channel region 131f, and is connected to a connector 179 through a contact hole 69. The connector 179 may be included in the third conductive layer in the cross-sectional view.

The seventh transistor T1 includes the channel region 131g, a source region 136g and a drain region 137g that are the conductive regions of the active pattern 130 disposed at respective sides of the channel region 131g, and a gate electrode 155g overlapping the channel region 131g. The gate electrode 155g is a part of the third scan line 154. The source region 136g is disposed upward based on the third scan line 154 in the plan view, is connected to the channel region 131g, and is connected to the drain region 137f of the sixth transistor T6. The drain region 137g is disposed downward based on the third scan line 154 in the plan view and is connected to the connector 175 through the contact hole 65, thereby receiving the initialization voltage Vint.

The capacitor Cst may include the driving gate electrode 155a and the extension part 157 of the storage line 156 overlapping each other in the plan view as two terminals. The capacitor Cst may maintain a voltage difference corresponding to a difference between the extension part 157 of the storage line 156 receiving the driving voltage ELVDD and the voltage of the driving gate electrode 155a. The extension part 157 of the storage line 156 may have a wider area than the driving gate electrode 155a in the plan view, and may cover the entire area of the corresponding driving gate electrode 155a.

The second conductive layer may further include a shielding pattern 158 overlapping the data line 171. The shielding pattern 158 is connected to the driving voltage line 172 through a contact hole 66, thereby receiving the driving voltage ELVDD. The shielding pattern 158 shields between the driving gate node GN and the data line 171, thereby blocking the voltage change of the driving gate node GN by the change of the data signal Dm. According to some exemplary embodiments of the present invention, the shielding pattern 158 may be omitted.

The display device, according to an exemplary embodiment of the present invention, may further include a fourth conductive layer including a plurality of pixel electrodes 191a, 191b, and 191c and a pixel conductive pattern 192. The fourth conductive layer is disposed on a different layer from the first conductive layer, the second conductive layer, and the third conductive layer in the cross-sectional view. For example, the fourth conductive layer may be disposed on the third conductive layer in the cross-sectional view, and may include the same material and may be disposed on the same layer.

The plurality of pixel electrodes 191a, 191b, and 191c may be arranged in a pentile matrix structure. For example, the pixel electrode 191a of the red pixel R and the pixel electrode 191c of the blue pixel B may be alternately arranged in the horizontal direction, the pixel electrode 191a of the red pixel R and the pixel electrode 191b of the green pixel G may be alternately arranged in a first diagonal direction, and the pixel electrode 191c of the blue pixel B and the pixel electrode 191b of the green pixel G may be alternately arranged in a second diagonal direction, which may be different from the first diagonal direction. However, the arrangement of the pixel electrodes 191a, 191b, and 191c is not limited thereto.

The pixel electrode 191a of the red pixel R may be smaller than the pixel electrode 191c of the blue pixel B, and the pixel electrode 191b of the green pixel G may be smaller than the pixel electrode 191a of the red pixel R.

Each of the pixel electrodes 191a, 191b, and 191c is connected to the connector 179 through a contact hole 89, thereby receiving the voltage.

The pixel conductive pattern 192 may be bent along an edge of the adjacent pixel electrodes 191a, 191b, and 191c, and may include a straight part (192a, 192b, and 192c) and an oblique part 193 that are alternately arranged, respectively. The straight part (192a, 192b, and 192c) may extend to be mainly parallel to the scan lines 151, 152, and 154, and the oblique part 193 may obliquely extend in the extending direction of the straight part (192a, 192b, and 192c). The straight part 192a may be adjacent on the pixel electrode 191a of the red pixel R, the straight part 192b may be adjacent on the pixel electrode 191b of the green pixel G, and the straight part 192c may be adjacent on the pixel electrode 191c of the blue pixel B.

The pixel conductive pattern 192 may transmit the initialization voltage Vint.

Referring to FIG. 3 to FIG. 6, the channel region 131c_1 of the upper third transistor T3_1, the boundary between the channel region 131c_1 and the source region 136c_1, and the boundary between the channel region 131c_1 and the drain region 137c_1 are each covered, in the plan view, by the fourth conductive layer.

The channel region 131c_1 of the upper third transistor T3_1 of the red pixel R, the boundary between the channel region 131c_1 and the source region 136c_1, and the boundary between the channel region 131c_1 and the drain region 137c_1 each overlap the pixel electrode 191a in the plan view, thereby being disposed in the plane region of the pixel electrode 191a. The channel region 131c_1 of the upper third transistor T3_1 of the green pixel G, the boundary between the channel region 131c_1 and the source region 136c_1, and the boundary between the channel region 131c_1 and the drain region 137c_1 each overlap the pixel conductive pattern 192 in the plan view, and for example, overlap the straight part 192b of the pixel conductive pattern 192, thereby being disposed in the plane region of the pixel conductive pattern 192. The channel region 131c_1 of the upper third transistor T3_1 of the blue pixel B, the boundary between the channel region 131c_1 and the source region 136c_1, and the boundary between the channel region 131c_1 and the drain region 137c_1 each overlap the pixel electrode 191c in the plan view, thereby being disposed in the plane region of the pixel electrode 191c.

Accordingly, although the external light is incident to the display device, the external light is blocked by the fourth conductive layer including the pixel electrodes 191a, 191b, and 191c and the pixel conductive pattern 192 such that the external light may be prevented from being incident into the channel region 131c_1 of the upper third transistor T3_1. For example, although the boundary between the channel region 131c_1 and the drain region 137c_1 of the upper third transistor T3_1 is not covered by the shielding part 176, the boundary between the channel region 131c_1 and the drain region 137c_1 along with the channel region 131c_1 are covered by the fourth conductive layer such that the external light may be blocked from being incident into the channel region 131c_1 of the upper third transistor T3_1. Accordingly, the leakage current due to the light is blocked in the upper third transistor T3_1 directly connected to the driving gate node GN such that the voltage change of the capacitor Cst may be suppressed.

Next, a cross-sectional structure of the display device, according to an exemplary embodiment of the present invention, will be described in detail with reference to FIG. 3 to FIG. 8.

A buffer layer 120 may be disposed on a substrate 110. The buffer layer 120 blocks impurities from the substrate 110 from contaminating an upper layer above the buffer layer 120. For example, the buffer layer 120 may block impurities from the substrate 110 from penetrating into the active pattern 130 so as to increase desirable characteristics of the active pattern 130 and reduce stress applied to the active pattern 130. The buffer layer 120 may include an inorganic insulating material such as a silicon nitride (SiNx) or a silicon oxide (SiOx), or an organic insulating material. At least part of the buffer layer 120 may be omitted.

The above-described active pattern 130 is disposed on the buffer layer 120, and a first insulating layer 141 is disposed on the active pattern 130.

The above-described first conductive layer may be disposed on the first insulating layer 141. The first conductive layer may include a metal such as copper (Cu), aluminum (Al), molybdenum (Mo), or alloys thereof.

A second insulating layer 142 may be disposed on the first conductive layer and the first insulating, layer 141.

The above-described second conductive layer may be disposed on the second insulating layer 142. The second conductive layer may include a metal such as copper (Cu), aluminum (Al), molybdenum (Mo) or alloys thereof.

A third insulating layer 160 may be disposed on the second conductive layer and the second insulating layer 142.

At least one among the first insulating layer 141, the second insulating layer 142, and the third insulating layer 160 may include the inorganic insulating material such as the silicon nitride (SiNx), the silicon oxide (SiOx) and/or the organic insulating material.

The first insulating layer 141, the second insulating layer 142, and the third insulating layer 160 may include the contact hole 61 disposed on the driving gate electrode 155a, the contact hole 62 disposed on the source region 136b of the second transistor T2, the contact hole 63 disposed on the drain region 137c_1 of the upper third transistor T3_1 or the drain region 137d_1 of the left fourth transistor T4_1, the contact hole 64 disposed on the initialization voltage line 159, the contact hole 65 disposed on the source region 136d_2 of the right fourth transistor T4_2 or the drain region 137g of the seventh transistor T7, the contact hole 66 disposed on the shielding pattern 158, the contact hole 67 disposed on the source region 136e of the fifth transistor 15, the contact hole 68 disposed on the extension part 157 of the storage line 156, and the contact hole 69 disposed on the drain region 137f of the sixth transistor 16. The contact hole 61 may be formed through the opening 51 of the extension part 157 of the storage line 156.

The above-described third conductive layer may be disposed on the third insulating layer 160. The third conductive layer may include the metal such as copper (Cu), aluminum (Al), molybdenum (Mo), or the alloy thereof.

The extension part 157 of the storage line 156 overlaps the driving gate electrode 155a with the second insulating layer 142 interposed therebetween, thereby forming the capacitor Cst.

A passivation layer 180 is disposed on the third conductive layer and the third insulating layer 160. The passivation layer 180 may include an organic insulating material such as a polyacrylate resin and a polyimide resin, and an upper surface of the passivation layer 180 may be substantially flat. The passivation layer 180 may include the contact hole 89 disposed on the connector 179.

The above-described fourth conductive layer may be disposed on the passivation layer 180.

A pixel defining layer (PDL) 350 may be disposed on the passivation layer 180 and the fourth conductive layer. The pixel defining layer 350 has an opening 351 formed on the pixel electrodes 191a, 191b, and 191c.

An emission layer 370 is disposed on the pixel electrodes 191a, 191b, and 191c. The emission layer 370 may be disposed in the opening 351. The emission layer 370 may include an organic light emitting material or an inorganic light emitting material.

A common electrode 270 is disposed on the emission layer. The common electrode 270 may also be formed on the pixel defining layer 350, thereby being extended throughout the plurality of pixels.

The pixel electrodes 191a, 191b, and 191c, the emission layer 370, and the common electrode 270 together form the light emitting diode (LED) ED.

An encapsulation layer protecting the light emitting diode (LED) ED may be disposed on the common electrode 270. The encapsulation layer may include the inorganic layer and the organic layer that are alternately stacked.

Next, display devices, according to exemplary embodiments of the present invention, will be described with reference to FIG. 9 to FIG. 15 as well as the above-described drawings. It may be assumed that elements not specifically described below are similar to or identical to corresponding elements that have already been described.

Figure 9:
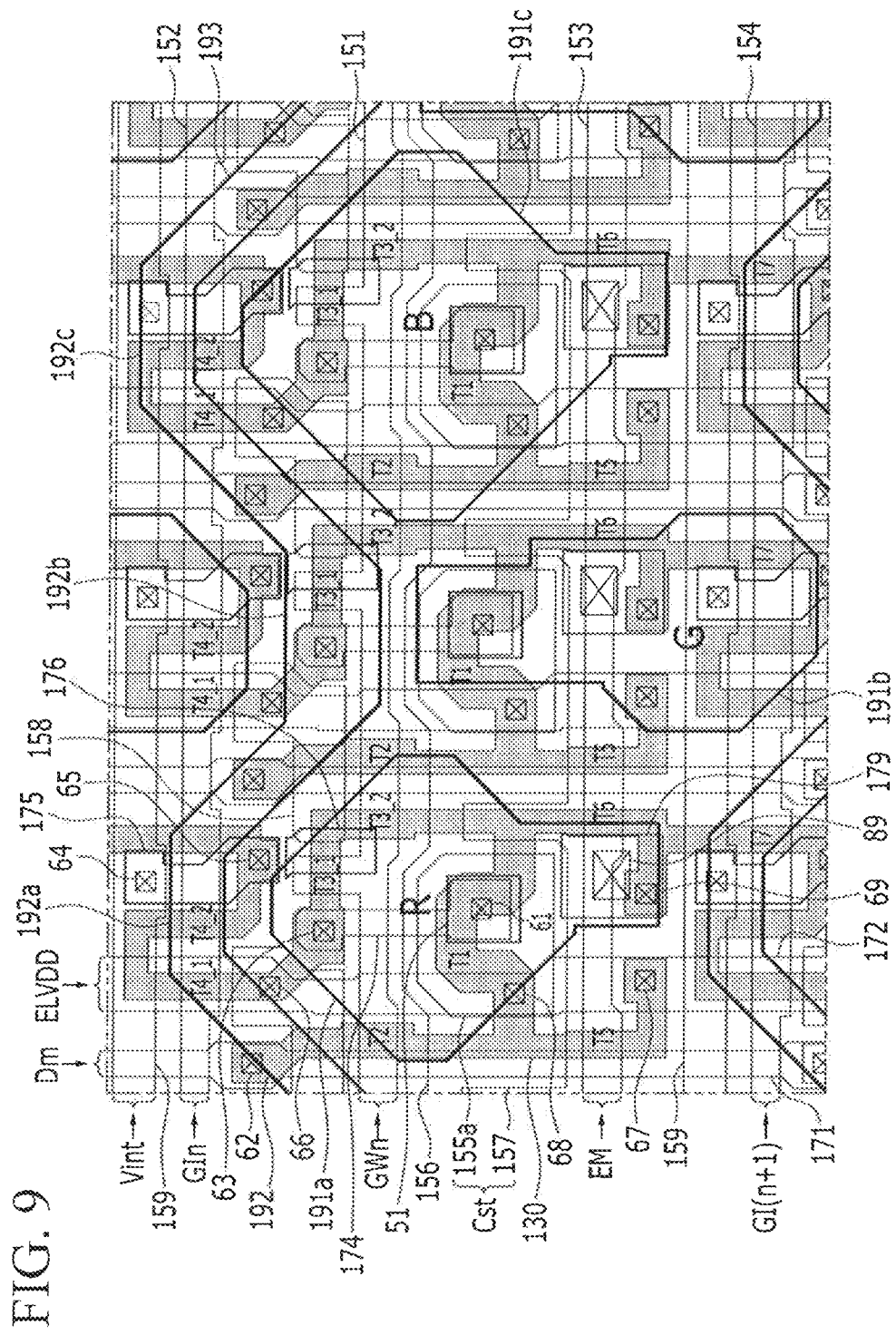
FIG. 9 is a top plan view illustrating a plurality of pixels of a display device according to an exemplary embodiment of the present invention.

First, referring to FIG. 9, the display device may be mostly the same as the display device according to the above-described exemplary embodiment shown in FIG. 1 to FIG. 8, however, in the present example, the shielding part 176 is spaced apart from the connector 175. The shielding part 176 may be disposed at the same layer as the connector 175, and may be disposed at a different layer in the cross-sectional view.

Figure 10:
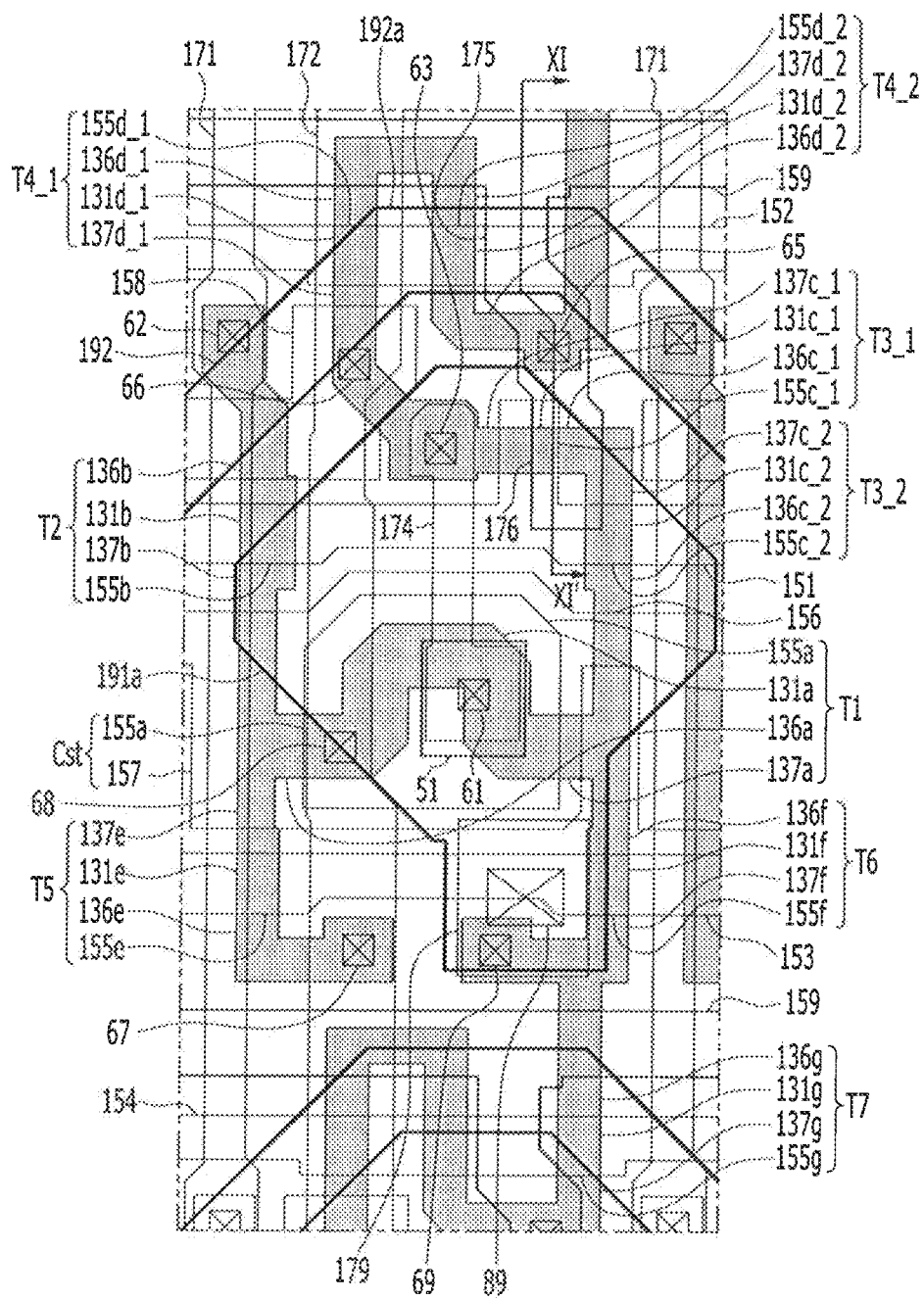
FIG. 10 is a top plan view illustrating one pixel of a display device according to an exemplary embodiment of the present invention.
Figure 11:
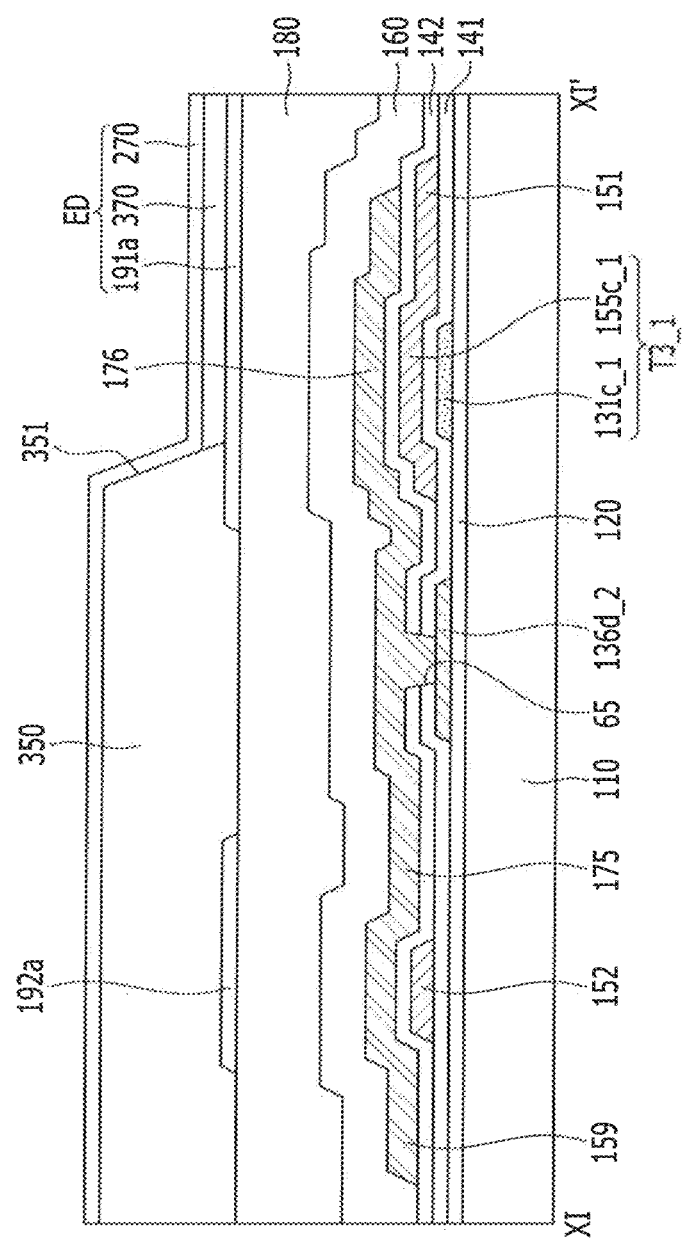
FIG. 11 is a cross-sectional view illustrating a display device shown in FIG. 10 taken along a line XI-XI'.

Next, referring to FIG. 10 and FIG. 11, the display device, according to an exemplary embodiment of the present invention, is mostly the same as the display device according to the above-described exemplary embodiment, however the connector 175 is included in the second conductive layer in the cross-sectional view. Accordingly, the connector 175 is disposed at the same layer as the initialization voltage line 159, and may be physically and electrically connected to the initialization voltage line 159. The shielding part 176 may also be included in the second conductive layer and may be connected to the connector 175.

Figure 12:
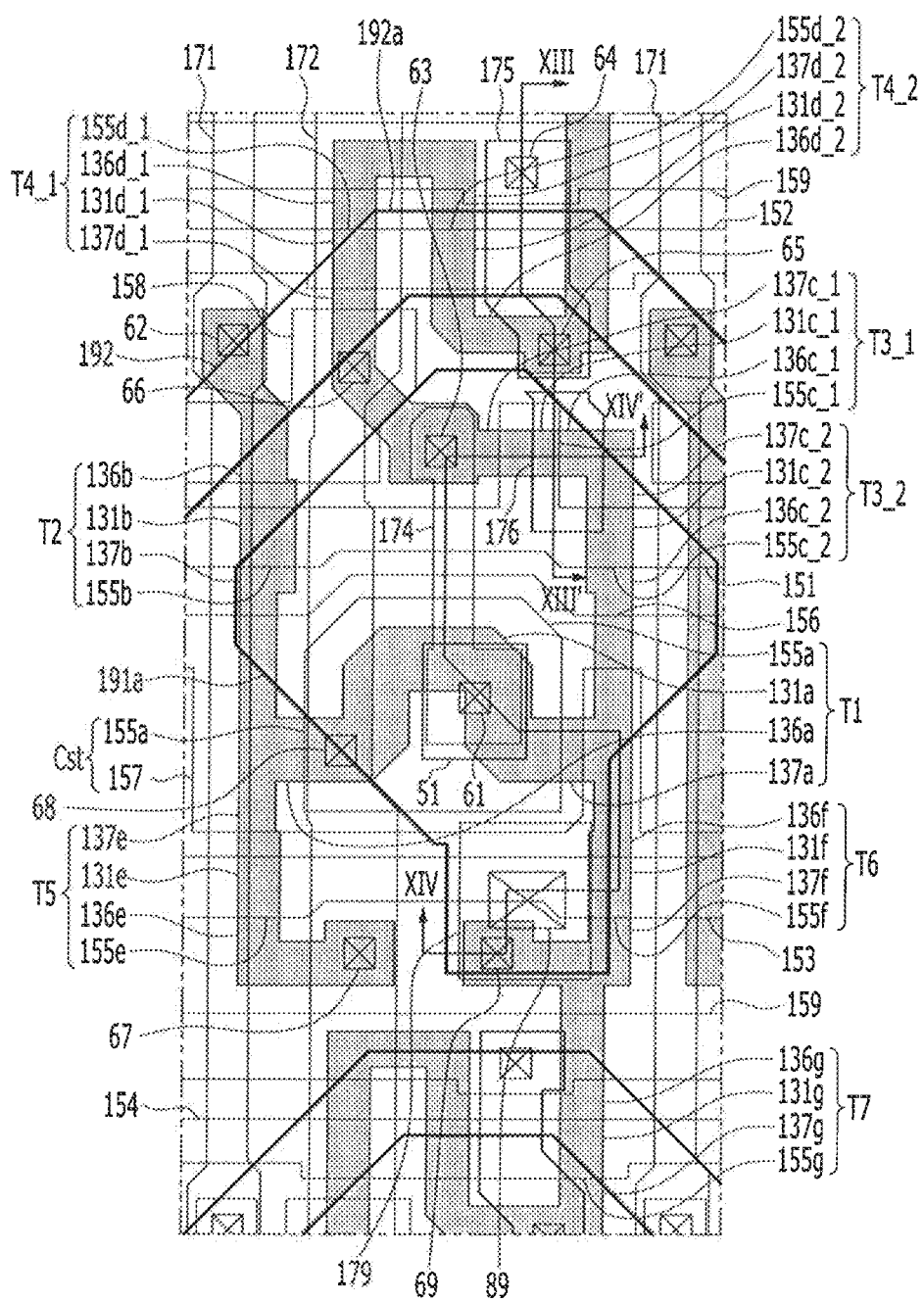
FIG. 12 is a top plan view illustrating one pixel of a display device according to an exemplary embodiment of the present invention.
Figure 13:
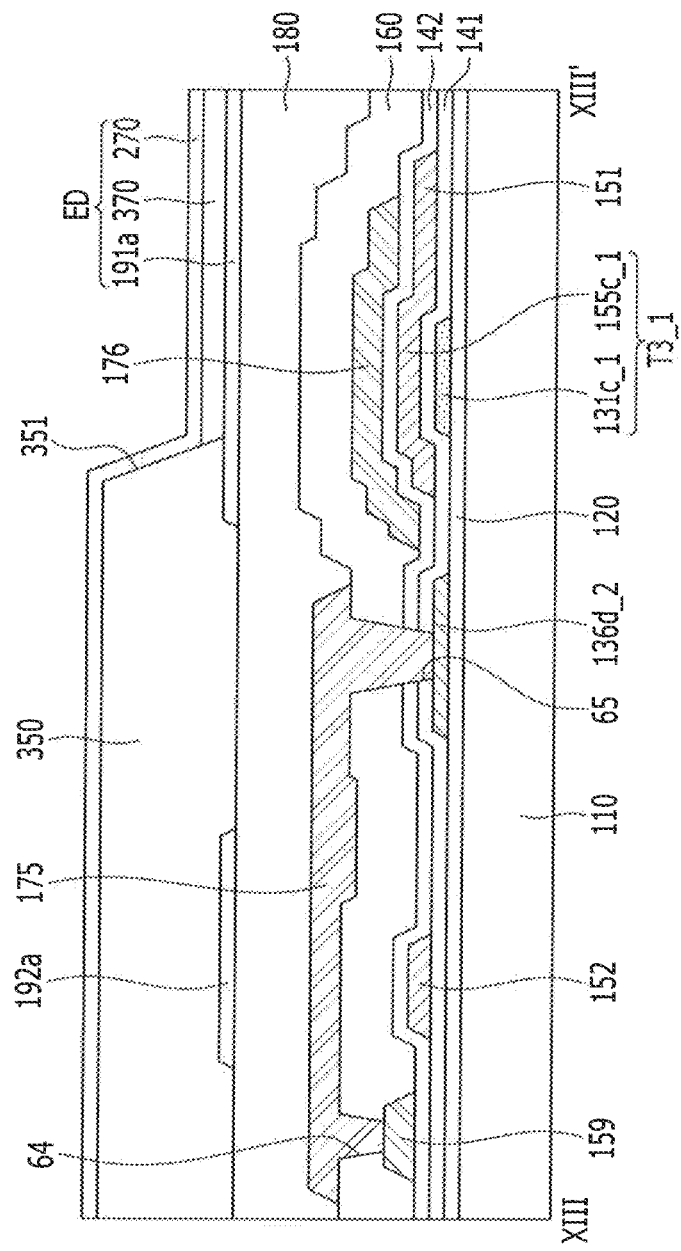
FIG. 13 is a cross-sectional view illustrating a display device shown in FIG. 12 taken along a line XIII-XIII'.
Figure 14:
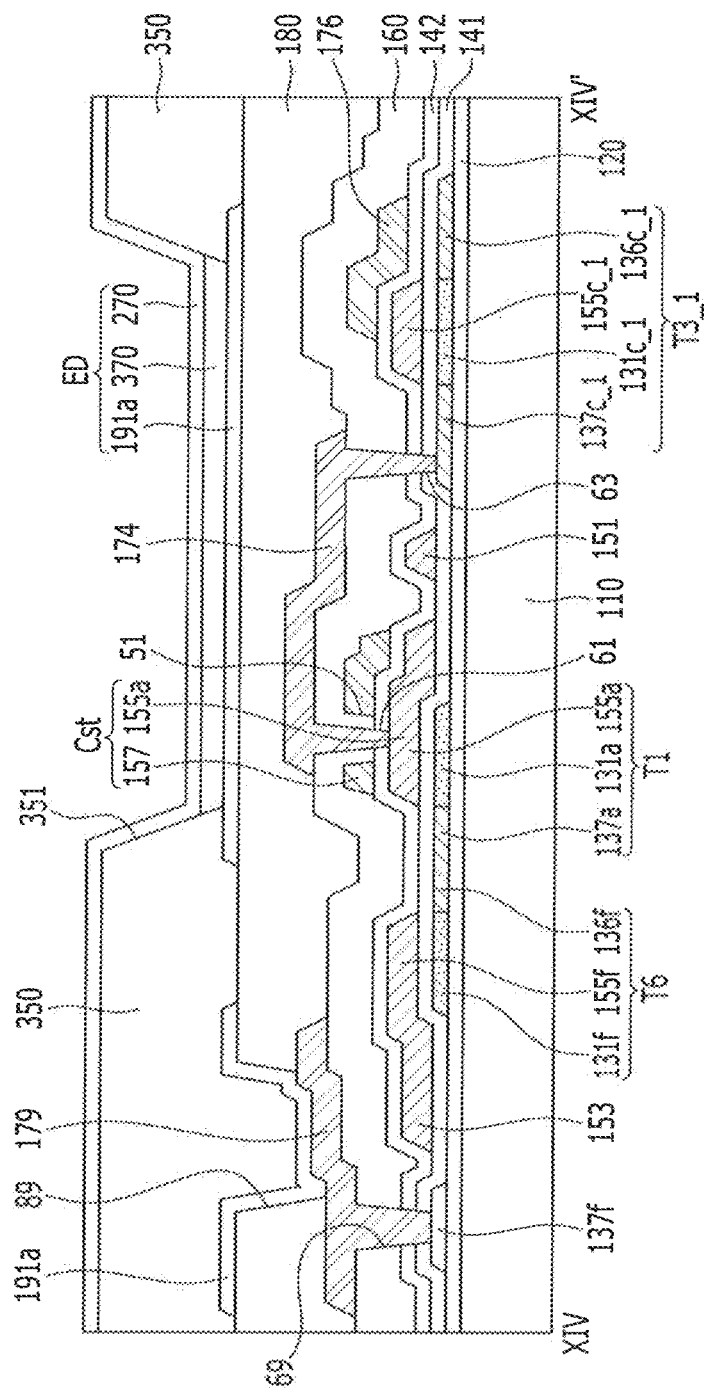
FIG. 14 is a cross-sectional view illustrating a display device shown in FIG. 12 taken along a line XIV-XIV'.

Next, referring to FIG. 12 to FIG. 14, the display device, according to an exemplary embodiment of the present invention, is mostly the same as the display device according to the above-described exemplary embodiment shown in FIG. 10 and FIG. 11, however the shielding part 176 is spaced apart from the connector 175. The shielding part 176 may be disposed at a different layer from the connector 175 in the cross-sectional view. For example, the shielding part 176 may, be included in the second conductive layer.

Figure 15:
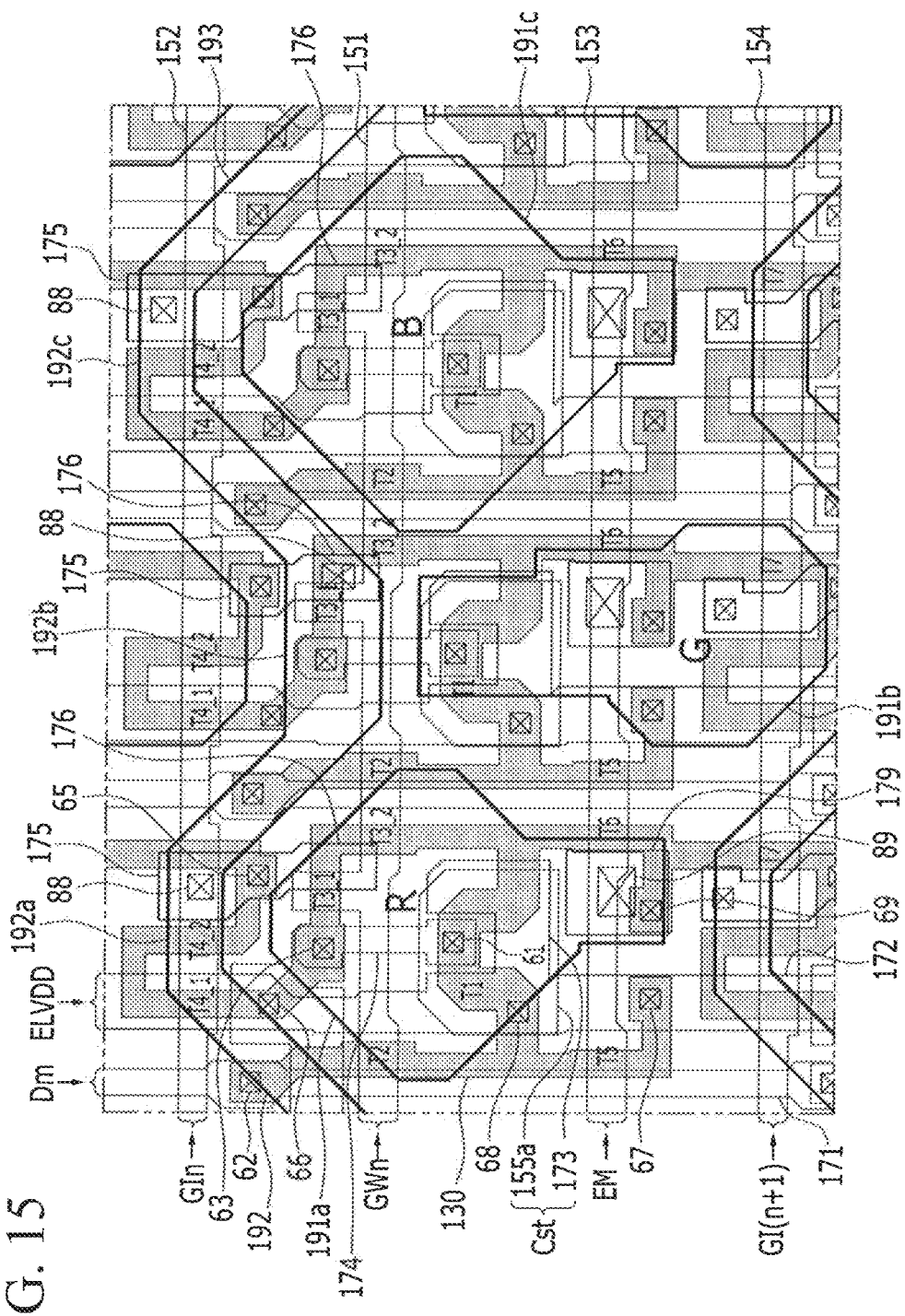
FIG. 15 is a top plan view illustrating one pixel of a display device according to an exemplary embodiment of the present invention.

Next, referring to FIG. 15, the display device, according to an exemplary embodiment of the present invention, is mostly the same as the display device according to the above-described exemplary embodiment, however the second conductive layer including the storage line 156, the initialization voltage line 159, the shielding pattern 158, and the like may be omitted. Also, the second insulating layer 142 may be omitted.

The driving voltage line 172 may include an extension part 173 overlapping the driving gate electrode 155a, and the extension part 173 and the driving gate electrode 155a overlap each other with the insulating layer (e.g., the above-described third insulating layer 160) interposed therebetween in the plan view to form the capacitor Cst. Accordingly, space utilization efficiency may be increased and the capacitor Cst of sufficient capacitance may be formed.

The passivation layer 180 may include a contact hole 88 disposed on the connector 175. The pixel conductive pattern 192 may transmit the initialization voltage Vint and may be electrically connected to the connector 175 through the contact hole 88, thereby transmitting the initialization voltage Vint to the connector 175.

While this invention has been described in connection with exemplary embodiments, it is to be understood that the invention is not limited to the disclosed embodiments, but, on the contrary, is intended to cover various modifications and equivalent arrangements included within the spirit and scope of the present invention.

What is claimed is:

1. A display device, comprising:
   a plurality of signal lines;
   a plurality of pixels connected to the plurality of signal lines; and
   a pixel conductive pattern,
   wherein the plurality of pixels comprises a first pixel and a second pixel that are adjacent each other,
   wherein each of the first pixel and the second pixel includes:
   a first transistor including a first gate electrode, a first channel region at least partially overlapping the first gate electrode in a plan view, a first source region and a first drain region facing the first source region, with the first channel region interposed between the first source region and the first drain region;
   a second transistor including a second gate electrode, a second channel region at least partially overlapping the second gate electrode in the plan view, a second drain region connected to the first gate electrode, and a second source region facing the second drain region with the second channel region interposed between the second source region and the second drain region; and a shielding part that at least partially overlaps a boundary between the second source region and the second channel region and does not overlap a boundary between the second drain region and the second channel region in the plan view, wherein the first pixel includes a first pixel electrode, and the second pixel includes a second pixel electrode, wherein the pixel conductive pattern is bent along an edge of the first and second pixel electrodes and includes straight parts and oblique parts that are alternately arranged, wherein the first pixel electrode at least partially overlaps the boundary between the second source region and the second channel region and the boundary between the second drain region and the second channel region in the first pixel in the plan view; and the pixel conductive pattern at least partially overlaps the boundary between the second source region and the second channel region and the boundary between the second drain region and the second channel region in the second pixel in the plan view.

2. The display device of claim 1, further comprising:
a first connector connected to the first gate electrode and disposed in a different layer from the first gate electrode,
wherein the second drain region is connected to the first connector.

3. The display device of claim 2, further comprising:
an initialization voltage line transmitting an initialization voltage; and
a second connector connected to the initialization voltage line, wherein the shielding part is connected to the second connector.

4. The display device of claim 3, wherein, the shielding part is disposed in a same layer as the second connector in a cross-sectional view.

5. The display device of claim 3, wherein, the shielding part is disposed in a same layer as the first connector in a cross-sectional view.

6. The display device of claim 3, wherein, each of the first pixel and the second pixel further includes:
a third transistor including a third source region connected to the first drain region of the first transistor, a third drain region, and a third channel region disposed between the third source region and the third drain region,
wherein first pixel electrode is connected to the third drain region of the first pixel, and the second pixel electrode is connected to the third drain region of the second pixel, and
wherein the pixel conductive pattern is disposed in a same layer as the first pixel electrode and spaced apart from the first pixel electrode.

7. The display device of claim 6, wherein, the pixel conductive pattern transmits the initialization voltage.

8. The display device of claim 1, wherein, the plurality of signal lines include:
a plurality of scan lines transmitting a scan signal;
a data line crossing the plurality of scan lines and transmitting a data signal; and
a driving voltage line spaced apart from the data line and transmitting a driving voltage, wherein the first pixel further includes a fourth transistor including a fourth gate electrode, a fourth channel region at least partially overlapping the fourth gate electrode in the plan view, a fourth drain region connected to the first gate electrode, and a fourth source region facing the fourth drain region with the fourth channel region interposed therebetween, and a boundary between the fourth source region and the fourth channel region of the fourth transistor and a boundary between the fourth drain region and the fourth channel region at least partially overlap the driving voltage line in the plan view.

9. The display device of claim 8, further comprising:
a first connector connected to the first gate electrode and disposed at a different layer from the first gate electrode, and the fourth drain region is connected to the first connector.

10. The display device of claim 9, further comprising:
an initialization voltage line transmitting an initialization voltage; and
a second connector connected to the initialization voltage line,
wherein the shielding part is connected to the second connector.

11. The display device of any of claim 8, wherein:
the pixel conductive pattern at least partially overlaps the boundary between the fourth source region and the fourth channel region and the boundary between the fourth drain region and the fourth channel region in the first pixel in the plan view, and
the second pixel electrode at least partially overlaps the boundary between the fourth source region and the fourth channel region and the boundary between the fourth drain region and the fourth channel region in the second pixel in the plan view.

12. A display device comprising:
a plurality of signal lines and a plurality of pixels connected to the plurality of signal lines, wherein a first pixel included in the plurality of pixels includes:
a first transistor including a first gate electrode, a first channel region at least partially overlapping the first gate electrode in the plan view, and a first source region and a first drain region facing each other with the first channel region interposed therebetween, a second transistor including a second gate electrode, a second channel region at least partially overlapping the second gate electrode in the plan view, a second drain region connected to the first gate electrode, and a second source region facing the second drain region with the second channel region interposed therebetween, and a shielding part at least partially overlapping at least one of a boundary between the second source region and the second channel region and a boundary between the second drain region and the second channel region, wherein the shielding part is configured to transmit an initialization voltage.

13. The display device of claim 12, further comprising: a first connector connected to the first gate electrode and disposed at a different layer from the first gate electrode, and the second drain region is connected to the first connector.

14. The display device of claim 13, further comprising:
an initialization voltage line transmitting an initialization voltage; and
a second connector connected to the initialization voltage line, wherein the shielding part is connected to the second connector.

15. The display device of claim 14, wherein, the shielding part is disposed at a same layer as the second connector in a cross-sectional view.

16. The display device of claim 14, wherein, the first pixel further includes a third transistor including a third source region connected to the first drain region of the first transistor, a third drain region, and a third channel region disposed between the third source region and the third drain region, and a first pixel electrode connected to the third drain region, wherein a pixel conductive pattern disposed at a same layer as the first pixel electrode and spaced apart from the first pixel electrode is further included, and the first pixel electrode or the pixel conductive pattern at least partially overlaps the boundary between the second source region and the second channel region and the boundary between the second drain region and the second channel region in the plan view.

17. The display device of claim 16, wherein, the pixel conductive pattern transmits the initialization voltage.

18. The display device of claim 16, further comprising:
a second pixel adjacent to the first pixel, wherein the first pixel and the second pixel respectively include the first transistor, the second transistor, and the third transistor, the second pixel further includes a second pixel electrode connected to the third drain region of the third transistor included in the second pixel, the boundary between the second source region and the second channel region and the boundary between the second drain region and the second channel region that are included in the first pixel at least partially overlap the first pixel electrode in the plan view, and the boundary between the second source region and the second channel region and the boundary between the second drain region and the second channel region that are included in the second pixel at least partially overlap the pixel conductive pattern in the plan view.

19. The display device of claim 12, wherein, the plurality of signal lines include:
a plurality of scan lines transmitting a scan signal;
a data line crossing the plurality of scan lines and transmitting a data signal; and
a driving voltage line spaced apart from the data line and transmitting a driving voltage,
wherein the first pixel further includes a fourth transistor including a fourth gate electrode, a fourth channel region at least partially overlapping the fourth gate electrode in the plan view, a fourth drain region connected to the first gate electrode, and a fourth source region facing the fourth drain region with the fourth channel region interposed therebetween, and a boundary between the fourth source region and the fourth channel region of the fourth transistor and a boundary between the fourth drain region and the fourth channel region at least partially overlap the driving voltage line in the plan view.

20. The display device of claim 19, further comprising:
a first connector connected to the first gate electrode and disposed at a different layer from the first gate electrode, and the fourth drain region is connected to the first connector.

* * * * *